United States Patent
Lowe

(10) Patent No.: US 6,557,247 B1
(45) Date of Patent: May 6, 2003

(54) COMPONENT PLACEMENT APPARATUS

(75) Inventor: John Michael Lowe, Leicestershire (GB)

(73) Assignee: Technology Development Associate Operations Limited (GB)

(*) Notice: Subject to any disclaimer, the term of this patent is extended or adjusted under 35 U.S.C. 154(b) by 178 days.

(21) Appl. No.: 09/627,542

(22) Filed: Jul. 28, 2000

Related U.S. Application Data

(63) Continuation of application No. PCT/GB99/00297, filed on Jan. 28, 1999.

(51) Int. Cl.[7] .................. B23P 19/00; H05K 3/30
(52) U.S. Cl. .................. 29/740; 29/833; 29/743
(58) Field of Search .................. 29/739, 740, 743, 29/832, 833, DIG. 44; 414/799

(56) References Cited

U.S. PATENT DOCUMENTS

| | | | |
|---|---|---|---|
| 4,520,557 A | 6/1985 | Harigane et al. | 29/740 |
| 4,748,740 A | 6/1988 | Buck et al. | 29/740 |
| 4,763,400 A | 8/1988 | Deckers | 29/564.6 |
| 5,042,709 A | * 8/1991 | Cina et al. | 228/105 |
| 5,495,661 A | 3/1996 | Gromer et al. | 29/740 |

FOREIGN PATENT DOCUMENTS

| | | |
|---|---|---|
| DE | 36 23 031 | 1/1988 |
| DE | 40 22 316 | 1/1992 |
| EP | 0 190 372 | 8/1986 |
| EP | 0 401 405 | 12/1990 |

* cited by examiner

*Primary Examiner*—Edward K. Look
*Assistant Examiner*—Michael Leslie
(74) *Attorney, Agent, or Firm*—Piper Rudnick LLP

(57) ABSTRACT

A component placement apparatus including a head mount having at least one pick and place head; component carrier; and component receiver, the at least one pick and place head being arranged to pick up a component from the component carrier and place it on the component receiver, wherein the head mount is movable to move the at least one pick and place head in a single plane; the component carrier is movable in a plane transverse to the at least one pick and place head at a pick up position; and the component receiver is movable in a plane transverse to the at least one pick and place head at a placement position.

40 Claims, 4 Drawing Sheets

COMPONENT PLACEMENT APPARATUS

RELATED APPLICATION

This is a continuation of International Application No. PCT/GB99/00297, with an international filing date of Jan. 28, 1999, which is based on British Patent Application No. 9801875.7, filed Jan. 29, 1998.

FIELD OF THE INVENTION

The invention relates to component placement apparatus, particularly, but not exclusively, to apparatus for placing microchips on printed circuit boards.

BACKGROUND

Prior art apparatus for placing components such as microchips onto, for example, a printed circuit board comprise a pick and place head that moves to pick up the component from a component carrying means and then moves from that position to a position over the printed circuit board such that the pick and place head can then place the component on the printed circuit board. This requires considerable accuracy in the positioning of the pick and place head over the component carrying means and the printed circuit board. Additionally, the process is slow.

The prior art apparatus has the problem of being unable to provide a component placement apparatus that is sufficiently accurate and that can be operated at a sufficiently high speed for some purposes.

SUMMARY OF THE INVENTION

The invention provides a component placement apparatus comprising:

a head mount having at least one pick and place head;

component carrying means; and component receiving means, the at least one pick and place head being arranged to pick up a component from the component carrying means and place it on the component receiving means, characterized in that:

the head mount is movable to move the at least one pick and place head in a single plane;

the component carrying means is movable in a plane transverse to the at least one pick and place head at a pick up position; and the component receiving means is movable in a plane transverse to the at least one pick and place head at a placement position.

BRIEF DESCRIPTION OF THE DRAWINGS

The invention will now be described by way of example only with reference to the drawings, of which.

DETAILED DESCRIPTION OF THE INVENTION

Figure 1:
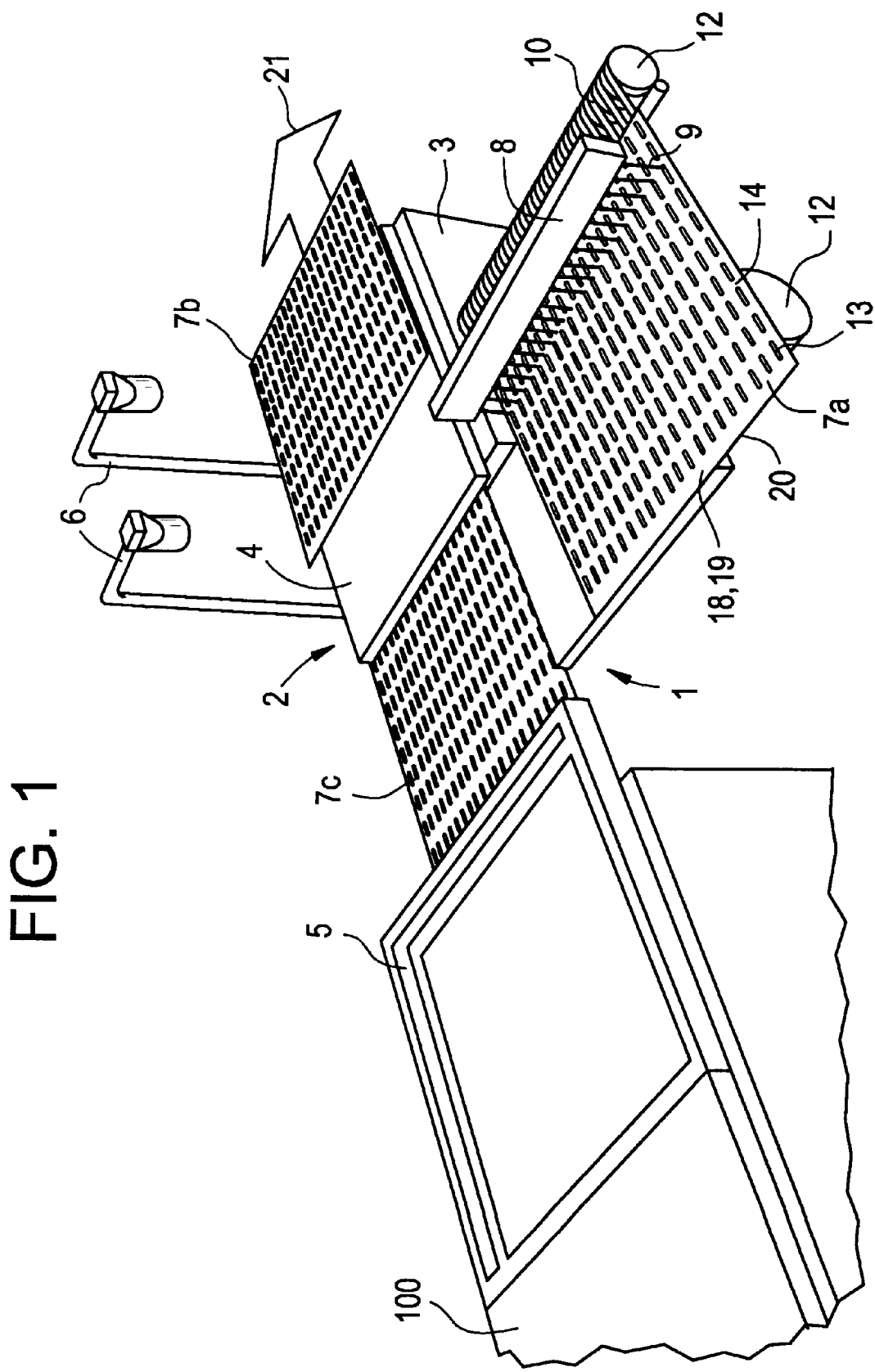
FIG. 1 shows a schematic, perspective view of a component placement apparatus according to an embodiment of the invention.
Figure 2:
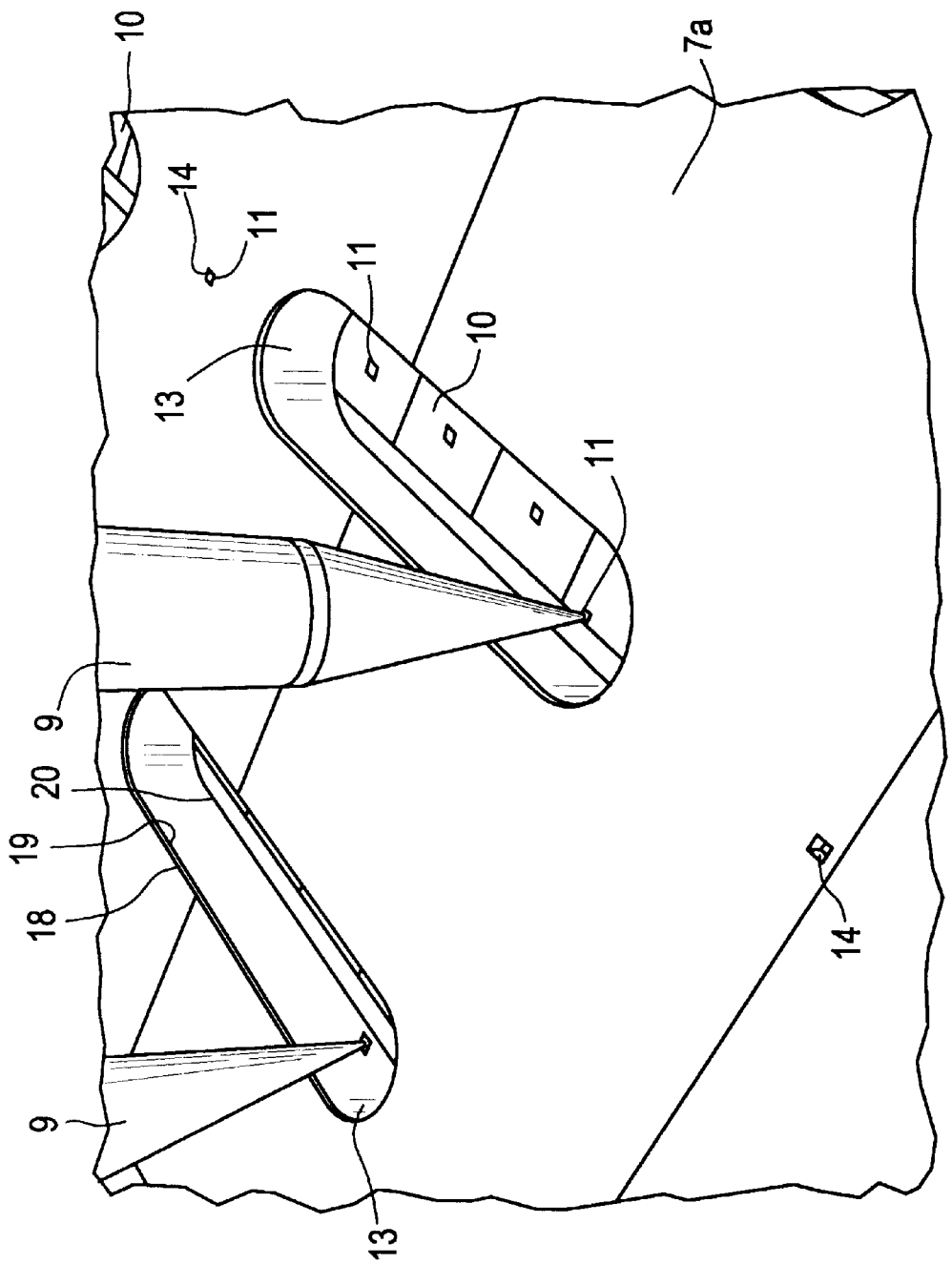
FIG. 2 shows a schematic, perspective view of part of the component placement apparatus of FIG. 1, in detail.

As shown in FIGS. 1 to 4, a component placement apparatus I comprises a component placement station 2 having a support table 3 for positioning a sheet of printed circuit boards 4 which have been, typically, printed at a screen printed at screen printing stations 100 and carried to the support table 3 by conveying means 5. Conductive adhesive is placed in the printed circuit boards 4 at one of the screen printing stations in preparation for the positioning of microchips or other components that will be placed on the printed circuit boards 4 by the component placement apparatus 1. An optical positioning system 6, such as that described in EP-A-0574459, checks the position of the printed circuit boards 4 on the support table 3.

Three carrier plates 7a,b,c are cycled around the component placement apparatus 1.

Plate 7a moves past a head mount 8 on which pick and place heads 9 are mounted. The head mount 8 is moved up and down in a vertical plane and plate 7a moves below the pick and place heads 9 in a horizontal plane. Tapes 10 carrying microchips or other components 11 are moved over rollers 12 in a horizontal plane in the same direction as the plate 7a but at a higher speed. Conveniently the plates 7a,b,c and the tapes 10 are indexed.

Plates 7a,b,c have holes 13 through the plate and indentations 14 for receiving the components 11. As shown in more detail in FIG. 2, the pick and place heads 9 are moved up and down by the head mount 8 such that they pass down through the holes 13 as the plate 7a passes the head mount 8. The pick and place heads 9 pick up a component 11 from the tape 10 and raise it above the plate 7a. As the plate 7a continues to move, the pick and place heads 9 descend again and deposit the components 11 in the indentations 14. The pick and place heads 9 may be moved up and down to different heights depending on whether they will pass through the holes 13 or place the components 11 in the indentations. Spring loading or other resilient mounting (not shown) of the pick and place heads 9 in the head mount 8 may be used to ensure that the heads 9 and the components 11 are not subjected to potentially damaging pressures.

The pick and place heads 9 hold the components 11 by means of a vacuum effect. A vacuum harness (not shown) of a type known in the art is attached to head mount 8 and vacuum means are operated to cause the heads 9 to pick up the components 11 and deactivated to cause the heads 9 to release the components 11.

Figure 3:
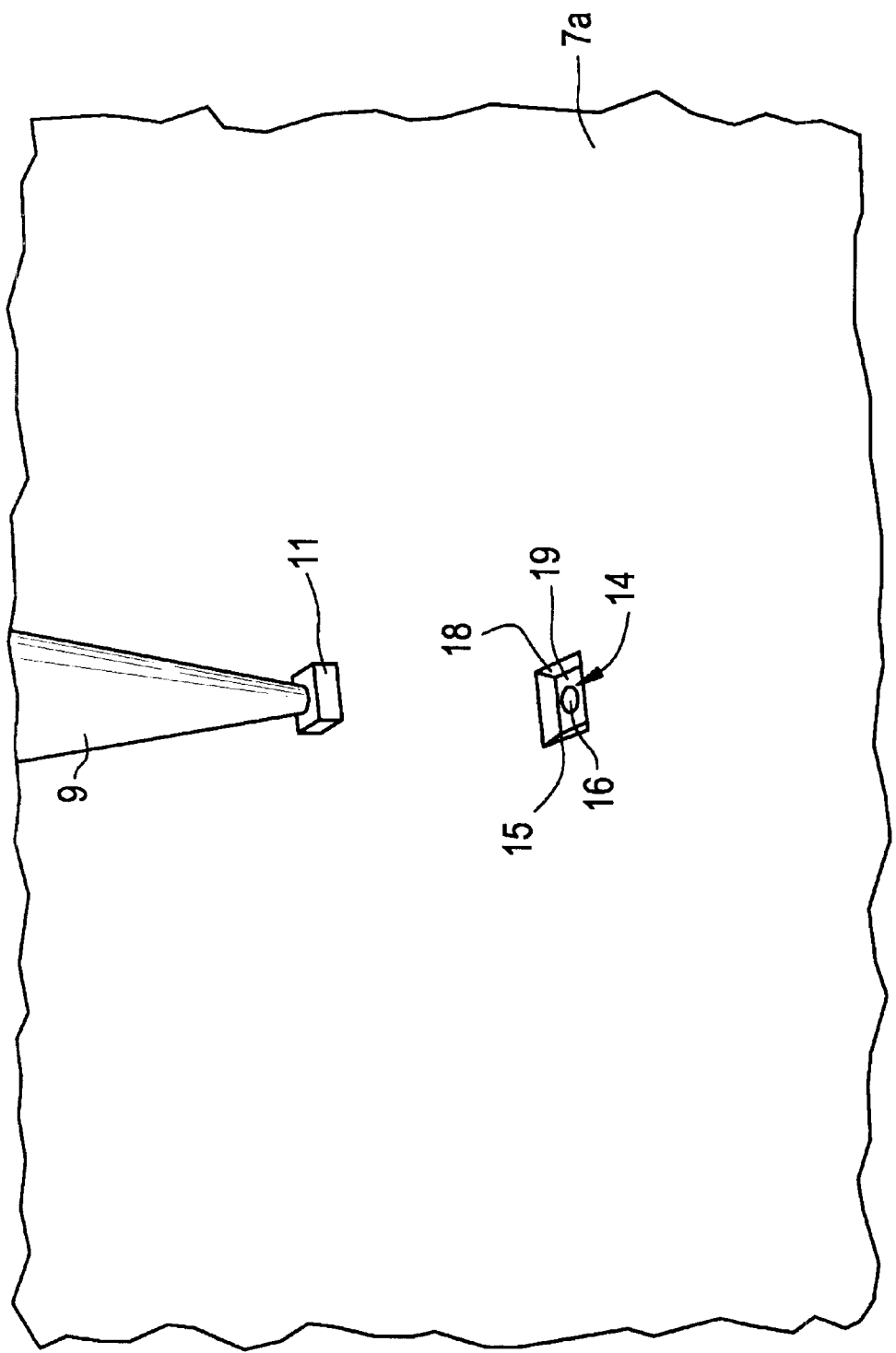
FIG. 3 shows a schematic, perspective view of detail of the part of the component placement apparatus shown in FIG. 2.
Figure 4:
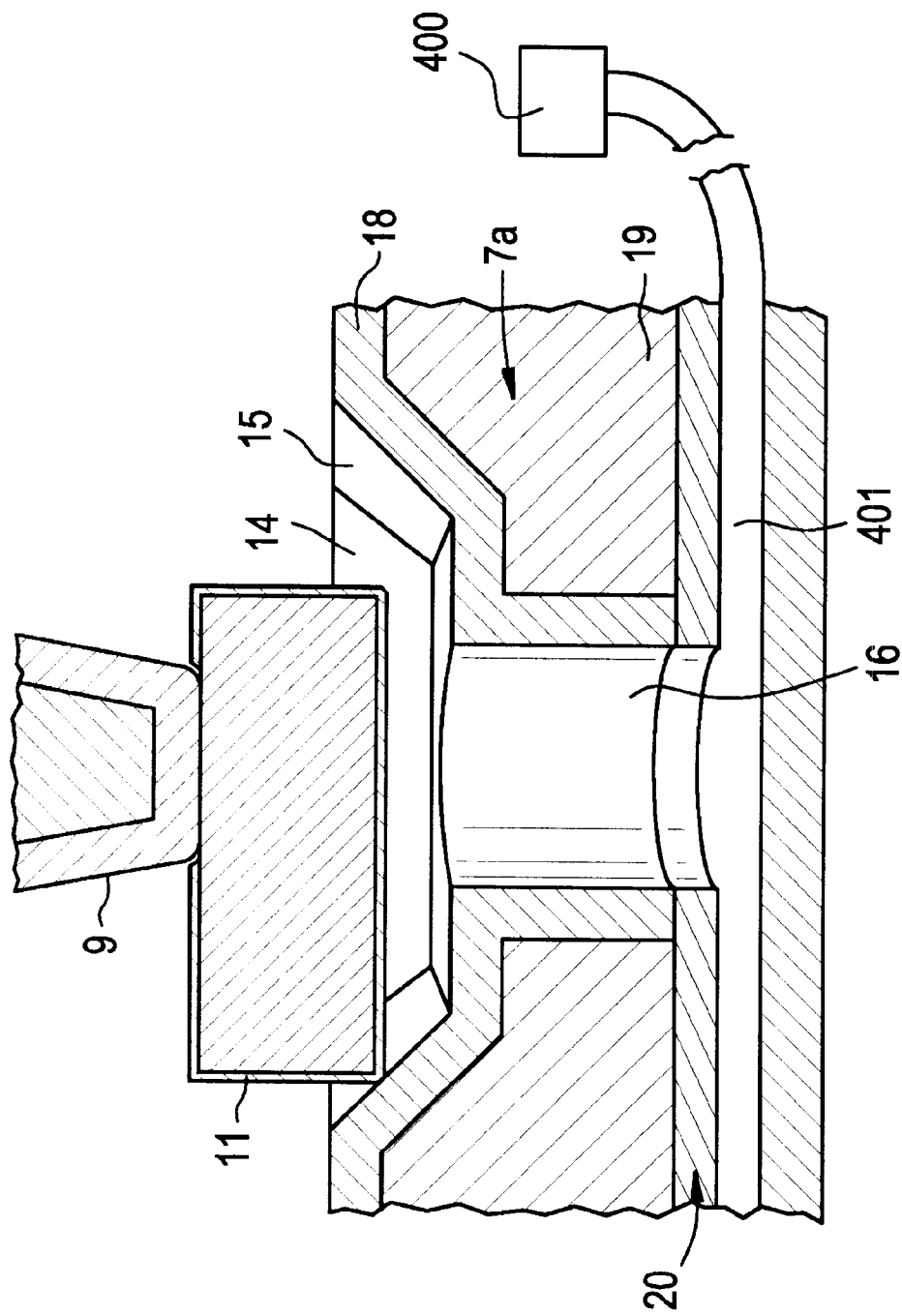
FIG. 4 shows a schematic, side view of detail of the part of the component placement apparatus shown in FIG. 3.

As shown in more detail in FIGS. 3 and 4, the indentation 14 has tapering sides 15 and a hole 16 in its base. The hole 16 is connected to vacuum means (not shown) to hold the component 11 in the indentation 14 when the plate 7a is moved. Plate 7a has a top plate 17 comprising a stainless steel layer 18 with the indentations 14 etched therein attached to an aluminum layer 19 having the round holes 16 formed therein. Plate 7a also has a bottom layer 20 including channels (not shown) connecting the holes 16 to vacuum pump 400 by way of a vacuum harness plate 401.

The tapering sides 15 of the indentations 14 ensure that a component 11 slides into the correct position in the indentation 14, as shown in detail in FIG. 4.

Referring back to FIG. 1, when the required number of components 11 have been positioned in the indentations 14, the vacuum pump 400 is operated through base 20 of plate 7a to hold the components in position. Plate 7a completes its travel past head mount 8 and it inverted to the position shown by plate 7b over the printed circuit boards 4. The optical alignment system 6 corrects the positioning of plate 7b with respect to the printed circuit boards 4 and plate 7b is lowered onto the printed circuit boards 4, the vacuum is released and the components 11 are placed on plate 7b and held in position by the conductive adhesive on the boards 4.

The plate 7b, which is now empty, is moved to the position shown by plate 7c from where it is inverted back to the position from where it can pass below the head mount 8 again, as shown by plate 7a.

The printed circuit boards 4 are moved off from the component placement station 2 in the direction of arrow 21 and the next sheet of printed circuit boards 4 is moved into position from the screen printing stations.

The cycle of loading a carrier plate 7 by placing the components 11 using pick and place heads 9 that only move up and down, inverting the plate 7 onto the printed circuit boards 4 and returning the carrier plate 7 ready to be reloaded allows fast and accurate placement of components on printed circuit boards that overcomes many of the problems of prior art arrangements.

Thus, in one embodiment, the invention provides a component placement apparatus wherein:

the head mount is movable to reciprocate in a single plane and the component carrying means and the component receiving means are movable in a direction transverse to the movement of the head mount;

the component carrying means is positioned to move in a first plane relative to the head mount and the component receiving means is positioned to move in a second plane relative to the head mount, the second plane being closer to the head mount than the first plane; and the component receiving means has holes therein such that the pick and place head can pass through a hole to pick up a component from the component carrying means, lift the component through the hole and place it on the component receiving means.

In a second embodiment the invention provides a component placement apparatus wherein:

the head mount is movable to reciprocate in a single plane and the component carrying means and the component receiving means are movable in a direction transverse to the movement of the head mount;

the component carrying means is positioned to move in a first plane relative to the head mount and the component receiving means is positioned to move in a second plane relative to the head mount, the first plane being closer to the head mount than the second plane; and either the component carrying means has holes therein such that the pick and place head picks up a component from the component carrying means and passes through the hole to place the component on the component receiving means or the component carrying means moves from a first position in which the components are in line with the pick and place heads and a second position in which the components are not in line with the pick and place heads such that the pick and place head picks up a component from the component carrying means in the first position, the component carrying means moves to the second position and the pick and place head places the component on the component receiving means.

In a third embodiment the invention provides a component placement apparatus wherein the head mount is movable to rotate in a single plane such that the head mount rotates to move the pick and place head to a first pick up position in which the pick and place head can pick up a component from the component carrying means and the head mount then rotates to move the pick and place head to a second placement position where the pick and place head places the component on the component receiving means.

Preferably the component carrying means and the component receiving means are movable in a direction that is normal to the position of the at least one pick and place head at the pick up and placement positions.

Preferably means are provided to move the component carrying means in a direction transverse to the direction of movement of the at least one pick and place head. Advantageously the means to move the component carrying means comprises rollers. In the second embodiment the means to move the component carrying means may comprise a spiral roller arrangement to move the component carrying means forward and to the side in a zigzag or sinusoidal path. Alternatively the component carrying means may comprise a rotary drum.

Preferably the component receiving means comprises a carrier plate and the apparatus further includes means to transfer the components from the carrier plate to one or more printed circuit boards.

Preferably the apparatus includes means to invert the carrier plate over the printed circuit boards.

Advantageously the carrier plate comprises means to retain the components on the carrier plate. Advantageously the means to retain the components on the carrier plate comprises a plurality of holes in the carrier plate over which the components are placed and vacuum means to create vacuum pressure through the holes and hold the components in place. Advantageously the vacuum means comprises a vacuum harness plate attached to the base of the carrier plate.

Advantageously the plate comprises a plurality of indentations in one surface into which the components are placed. Advantageously, if vacuum means are provided to retain the components on the carrier plate, holes are provided at the bottom of the indentations.

The holes in the component receiving means through which the pick and place heads pass are positioned ahead of indentations, relative to the movement of the component receiving means. The pick and place heads move downwards through the holes to pick up components from the component carrying means, lift the component back through the hole and place it on the component receiving means in an indentation. Preferably the indentations are tapered to correct slight misalignments.

Advantageously the carrier plate comprises two plates, a top plate and a base plate. Preferably the top plate comprises an aluminum plate comprising a plurality of round holes and having a top layer of thin stainless steel plate with etched holes, corresponding to the positions of the round holes; the process of etching can automatically provide these holes with tapered walls which together with the shape of the hole locates and aligns the chip. Preferably the base plate comprises a plate with channels connecting a vacuum pump to the holes in the top plate.

Alternatively the component receiving means may comprise one or more printed circuit boards having holes therein such that the pick and place head can pass through a hole to pick up a component from the component carrying means, lift the component through the hole and place it directly on the printed circuit board.

The head mount preferably supports a plurality of pick and place heads. Advantageously the movement of the head mount is a reciprocating movement in a vertical plane.

The component carrying means usually comprises tapes on which components are mounted. Advantageously the tapes move in parallel in a plane that is horizontal relative to the head mount. The tapes are usually moved at the same speed but in some arrangements they may be moved at different speeds. Alternatively the component carrying means comprises a sheet on which the components are mounted. Alternatively, the component carrying means may comprises any other suitable means of presentation.

Advantageously the component receiving means moves in the same direction as the component carrying means but at the same or different slower speed. Alternatively the component receiving means may be moved in the opposite direction to the component carrying means.

Preferably the movement of the component receiving means and the component carrying means are indexed. Advantageously the movement is controlled by stepper motors or a suitable similar arrangement. Advantageously when the component receiving means is loaded and moved to deposit the components, the component carrying means is stopped until the next component receiving means is ready to be moved relative to the head mount.

The invention further provides a screen printing and component placement apparatus comprising one or more screen printing stations and a component placement station, wherein the component placement station comprises a component placement apparatus comprising:

a head mount having a plurality of pick and place heads;

component carrying means; and component receiving means; the pick and place heads being arranged to pick up a component from the component carrying means and place it on the component receiving means, characterized in that:

the head mount is movable to move the pick and place heads in a single plane;

the component carrying means is movable in a plane transverse to the pick and place heads at a pick up position; and the component receiving means is movable in a plane transverse to the pick and place heads at a placement position.

In one embodiment the invention provides a screen printing and component placement apparatus wherein:

the head mount is movable to reciprocate in a single plane and the component carrying means and the component receiving means are movable in a direction transverse to the movement of the head mount;

the component carrying means is positioned to move in a first plane relative to the head mount and the component receiving means is positioned to move in a second plane relative to the head mount, the second plane being closer to the head mount than the first plane; and the component receiving means has holes therein such that the pick and place head can pass through a hole to pick up a component from the component carrying means, lift the component through the hole and place it on the component receiving means.

In a second embodiment the invention provides a screen printing and component placement apparatus wherein:

the head mount is movable to reciprocate in a single plane and the component carrying means and the component receiving means are movable in a direction transverse to the movement of the head mount;

the component carrying means is positioned to move in a first plane relative to the head mount and the component receiving means is positioned to move in a second plane relative to the head mount, the first plane being closer to the head mount than the second plane; and either the component carrying means has holes therein such that the pick and place head picks up a component from the component carrying means and passes through the hole to place the component on the component receiving means or the component carrying means moves from a first position in which the components are in line with the pick and place heads and a second position in which the components are not in line with the pick and place heads such that the pick and place head picks up a component from the component carrying means in the first position, the component carrying means moves to the second position and the pick and place head places the component on the component receiving means.

In a third embodiment the invention provides a screen printing and component placement apparatus wherein the head mount is movable to rotate in a single plane such that the head mount rotates to move the pick and place head to a first pick up position in which the pick and place head can pick up a component from the component carrying means and the head mount then rotates to move the pick and place head to a second placement position where the pick and place head places the component on the component receiving means.

Preferably the component carrying means comprises three carrier plates. Advantageously the three carrier plates are cycled through the component placement apparatus such that one plate is being loaded, one plate is being inverted to transfer the components to printed circuit boards and one plate is being returned ready for reloading; alternatively the three plates may be cycled such that a loaded plate is available to move to transfer components to printed circuit board as soon as the transfer from the previous plate has been effected. More than three plates may be used, if that gives greater efficiency. In an alternative embodiment the carrier plates themselves may comprise printed circuit boards that have been screen printed at the screen printing stations or produced by other methods.

I claim:

1. A component placement apparatus comprising:

a head mount having at least one pick and place head;

component carrying means; and component receiving means, the at least one pick and place head being arranged to pick up a component from the component carrying means and place it on the component receiving means, wherein:

the head mount is movable to move the at least one pick and place head in a single plane;

the component carrying means is movable in a first plane transverse to the at least one pick and place head at a pick up position; and the component receiving means is movable in a second plane transverse to the at least one pick and place head at a placement position; and wherein the head mount reciprocates in the single plane and the component carrying means and the component receiving means are movable in a direction transverse to the movement of the head mount;

the component carrying means is positioned to move in the first plane and the component receiving means is positioned to move in the second plane, the second plane being closer to the head mount than the first plane; and the component receiving means having holes therein such that the pick and place head can pass through a hole to pick up a component from the component carrying means, lift the component through the hole and place it on the component receiving means.

2. A component placement apparatus according to claim 1 wherein the reciprocating movement of the head mount is substantially in a vertical plane.

3. A component placement apparatus according to claim 1 wherein the component carrying means and the component receiving means are movable in a direction that is substantially normal to the position of the at least one pick and place head at the pick up and placement positions.

4. A component placement apparatus according to claim 1 wherein means are provided to move the component carrying means in a direction substantially transverse to the direction of movement of the at least one pick and place head.

5. A component placement apparatus according to claim 4 wherein the means to move the component carrying means comprises rollers.

6. A component placement apparatus in accordance with claim 4 wherein the reciprocating movement of the head mount is substantially vertical and the means to move the component carrying means comprises a spiral roller arrangement to move the component carrying means forward and to the side in a zigzag or sinusoidal path.

7. A component placement apparatus in accordance with claim 4 wherein the component carrying means comprises a rotary drum.

8. A component placement apparatus according to claim 1 wherein the head mount supports a plurality of pick and place heads.

9. A component placement apparatus according to claim 1 wherein the component carrying means comprises tapes on which components are mounted.

10. A component placement apparatus according to claim 9 wherein the tapes move in parallel in a plane that is substantially horizontal relative to the head mount.

11. A component placement apparatus according to claim 1 wherein the movement of the component receiving means and the component carrying means are indexed.

12. A component placement apparatus according to claim 11 wherein the movement of the component receiving means and the component carrying means are controlled by stepper motors or a suitable similar arrangement.

13. A component placement apparatus comprising:
a head mount having at least one pick and place head; component carrying means; and component receiving means, the at least one pick and place head being arranged to pick up a component from the component carrying means and place it one the component receiving means, wherein;
the head mount is movable to move the at least one pick and place head in a single plane;
the component carrying means is positioned to move in a first plane relative to the head mount and the component receiving means is positioned to move in a second plane relative to the head mount, the first plane being closer to the head mount than the second plane and being between said second plane and said head mount; and
either the component carrying means has holes therein such that the pick and place head picks up a component from the component carrying means and passes through the hole to place the component on the component receiving means or the component carrying means moves from a first position in which the components are in line with the pick and place heads and a second position in which the components are not in line with the pick and place heads such that the pick and place head picks up a component from the component carrying means in the first position, the component carrying means moves to the second position and the pick and place head places the component on the component receiving means.

14. A component placement apparatus according to claim 13 wherein means are provided to move the component carrying means in a direction substantially transverse to the direction of movement of the at least one pick and place head.

15. A component placement apparatus according to claim 14 wherein the means to move the component carrying means comprises rollers.

16. A component placement apparatus in accordance with claim 14 wherein the reciprocating movement of the head mount is substantially vertical and the means to move the component carrying means comprises a spiral roller arrangement to move the component carrying means forward and to the side in a zigzag or sinusoidal path.

17. A component placement apparatus in accordance with claim 14 wherein the component carrying means comprises a rotary drum.

18. A component placement apparatus according to claim 13 wherein the component carrying means comprises tapes on which components are mounted.

19. A component placement apparatus according to claim 18 wherein the tapes move in parallel in a plane that is substantially horizontal relative to the head mount.

20. A component placement apparatus comprising:
a head mount having at least one pick and place head;
component carrying means; and
component receiving means,
the at least one pick and place head being arranged to pick up a component from the component carrying means and place it on the component receiving means, wherein:
the head mount is movable to move the at least one pick and place head in a single plane;
the component carrying means is movable in a first plane transverse to the at least one pick and place head at a pick up position; and
the component receiving means is movable in a second plane transverse to the at least one pick and place head at a placement position, wherein the component receiving means comprises a carrier plate and the apparatus further includes means to transfer the components from the carrier plate to one or more printed circuit boards.

21. A component placement apparatus according to claim 20, wherein the carrier plate comprises a plurality of indentations in one surface into which the components are placed.

22. A component placement apparatus according to claim 20 wherein the apparatus includes means to invert the carrier plate over the printed circuit boards.

23. A component placement apparatus according to claim 20 wherein the carrier plate comprises means to retain the components on the carrier plate.

24. A component placement apparatus according to claim 23 wherein the means to retain the components on the carrier plate comprises a plurality of holes in the carrier plate over which the components are placed and vacuum means to create vacuum pressure through the holes and hold the components in place.

25. A component placement apparatus according to claim 24 wherein the vacuum means comprises a vacuum harness plate attached to the base of the carrier plate.

26. A component placement apparatus according to claim 20 wherein the carrier plate comprises a top plate and a base plate.

27. A component placement apparatus according to claim 26 wherein the top plate comprises an aluminum plate comprising a plurality of round holes and having a top layer of thin stainless steel plate with etched holes, corresponding to the positions of the round holes.

28. A component placement apparatus according to claim 26 wherein the base plate comprises a plate with channels connecting a vacuum pump to the holes in the top plate.

29. A component placement apparatus comprising a carrier plate having a plurality of indentations in one surface at locations corresponding with desired locations on a substrate to which components are to be transferred, means for placing components in the indentations and means for transferring the components from the carrier plate to the substrate, wherein the indentations are tapered to allow for slight misalignments.

30. A component placement apparatus comprising:
a head mount having at least one pick and place head;
component carrying means; and
component receiving means,
the at least one pick and place head being arranged to pick up a component from the component carrying means and place it on the component receiving means, wherein:
the head mount is movable to move the at least one pick and place head in a single plane;
the component carrying means is movable in a first plane transverse to the at least one pick and place head at a pick up position; and
the component receiving means is movable in a second plane transverse to the at least one pick and place head at a placement position, wherein the component receiving means comprises one or more printed circuit boards having holes therein such that the pick and place head can pass through a hole to pick up a component from the component carrying means, lift the component through the hole and place it directly on a printed circuit board.

31. A component placement apparatus comprising:
a head mount having at least one pick and place head;
component carrying means; and
component receiving means,
the at least one pick and place head being arranged to pick up a component from the component carrying means and place it on the component receiving means, wherein:
the head mount is movable to move the at least one pick and place head in a single plane;
the component carrying means is movable in a first plane transverse to the at least one pick and place head at a pick up position; and
the component receiving means is movable in a second plane transverse to the at least one pick and place head at a placement position, wherein the component carrying means comprises a sheet on which the components are mounted.

32. A component placement apparatus comprising:
a head mount having at least one pick and place head;
component carrying means; and
component receiving means,
the at least one pick and place head being arranged to pick up a component from the component carrying means and place it on the component receiving means, wherein:
the head mount is movable to move the at least one pick and place head in a single plane;
the component carrying means is movable in a first plane transverse to the at least one pick and place head at a pick up position; and
the component receiving means is movable in a second plane transverse to the at least one pick and place head at a placement position, wherein the component receiving means moves in the same direction as the component carrying means but at a slower speed.

33. A component placement apparatus comprising:
a head mount having at least one pick and place head;
component carrying means; and
component receiving means,
the at least one pick and place head being arranged to pick up a component from the component carrying means and place it on the component receiving means, wherein:
the head mount is movable to move the at least one pick and place head in a single plane;
the component carrying means is movable in a first plane transverse to the at least one pick and place head at a pick up position; and
the component receiving means is movable in a second plane transverse to the at least one pick and place head at a placement position, wherein the component receiving means is moved in substantially the opposite direction to the component carrying means.

34. A screen printing and component placement apparatus comprising one or more screen printing stations and a component placement station, wherein the component placement station comprises a component placement apparatus comprising:
a head mount having a plurality of pick and place heads;
component carrying means; and
component receiving means;
the pick and place heads being arranged to pick up a component from the component carrying means and place it on the component receiving means, wherein:
the head mount is movable to move the at least one pick and place head in a single plane;
the component carrying means is movable in a first plane transverse to the at least one pick and place head at a pick up position; and
the component receiving means is movable in a second plane transverse to the at least one pick and place head at a placement position.

35. A screen printing and component placement apparatus according to claim 34 wherein:
the head mount is movable to reciprocate in a single plane and the component carrying means and the component receiving means are movable in a direction transverse to the movement of the head mount;
the component carrying means is positioned to move in the first plane relative to the head mount and the component receiving means is positioned to move in the second plane relative to the head mount, the second plane being closer to the head mount than the first plane; and
the component receiving means has holes therein such that the pick and place head can pass through a hole to pick up a component from the component carrying means, lift the component through the hole and place it on the component receiving means.

36. A screen printing and component placement apparatus according to claim 35 wherein the reciprocating movement of the head mount is substantially in a vertical plane.

37. A screen printing and component placement apparatus according to claim wherein:
the head mount is movable to reciprocate in a single plane and the component carrying means and the component receiving means are movable in a direction transverse to the movement of the head mount;

the component carrying means is positioned to move in a first plane relative to the head mount and the component receiving means is positioned to move in a second plane relative to the head mount, the first plane being closer to the head mount than the second plane; and either the component carrying means has holes therein such that the pick and place head picks up a component from the component carrying means and passes through the hole to place the component on the component receiving means or the component carrying means moves from a first position in which the components are in line with the pick and place heads and a second position in which the components are not in line with the pick and place heads such that the pick and place head picks up a component from the component carrying means in the first position, the component carrying means moves to the second position and the pick and place head places the component on the component receiving means.

38. A screen printing and component placement apparatus according to claim 34 wherein the head mount is movable to rotate in a single plane such that the head mount rotates to move the pick and place head to a first pick up position in which the pick and place head can pick up a component from the component carrying means and the head mount then rotates to move the pick and place head to a second placement position where the pick and place head places the component on the component receiving means.

39. A screen printing and component placement apparatus according to claim 34 wherein the component carrying means comprises three carrier plates.

40. A component placement apparatus comprising:

a head mount having at least one pick and place head;

component carrying means; and component receiving means, the at least one pick and place head being arranged to pick up a component from the component carrying means and place it on the component receiving means, wherein:

the head mount is movable to move the at least one pick and place head in a single plane;

the component carrying means is movable in a plane transverse to the plane of movement of the at least one pick and place head the plane of movement of the component carrying means intersecting the plane of movement of the pick and place head at a pick up position; and the component receiving means is movable in a plane transverse to the plane of movement of the at least one pick and place head, the plane of movement of the component receiving means intersecting the plane of movement of the pick and place head at a pick up position and the plane of movement of the component receiving means being parallel to the plane of movement of the component carrying means, with one of the plane of movement of the component carrying means or the plane of movement of the component receiving means being between the plane of movement of the other of the component carrying means and the component receiving means and the head mount at the pick up position.

* * * * *